United States Patent
Pilo et al.

[19]

[11] Patent Number: 6,134,182
[45] Date of Patent: Oct. 17, 2000

[54] CYCLE INDEPENDENT DATA TO ECHO CLOCK TRACKING CIRCUIT

[75] Inventors: Harold Pilo, Underhill; James J. Covino, Montpelier, both of Vt.

[73] Assignee: International Business Machines Corporation, Armonk, N.Y.

[21] Appl. No.: 09/420,694

[22] Filed: Oct. 19, 1999

[51] Int. Cl.$^7$ .................................................. G11C 8/00
[52] U.S. Cl. ................................................ 365/233; 365/194
[58] Field of Search .................................... 365/233, 194

[56] References Cited

U.S. PATENT DOCUMENTS

| | | | |
|---|---|---|---|
| 5,440,514 | 8/1995 | Flannagan et al. ..................... | 365/194 |
| 5,557,781 | 9/1996 | Stones et al. .......................... | 395/550 |
| 5,790,838 | 8/1998 | Irish et al. ............................. | 395/555 |
| 5,815,462 | 9/1998 | Konishi et al. ....................... | 365/233 |
| 5,875,134 | 2/1999 | Cloud ..................................... | 365/193 |
| 5,920,511 | 7/1999 | Lee et al. ............................ | 365/189.05 |

OTHER PUBLICATIONS

G. T. Davis et al., "Digital Phase–Locked Loops Using Shared Logic, Accepting Variable Reference and System Clocks", IBM Technical Disclosure Bulletin, vol. 38, No. 9, Sep. 1995.

*Primary Examiner*—David Nelms
*Assistant Examiner*—Connie C. Yoha
*Attorney, Agent, or Firm*—Whitham, Curtis & Whitham; Robert A. Walsh, Esq.

[57] ABSTRACT

A comparator and variable delay circuit are provided to maintain the tracking between data and echo clocks in a double data rate (DDR)RAM device. This is accomplished by providing a global data signal (dummy data signal) that tracks with the actual memory array data. This global data signal is compared to the timing of the RAM clock (CLOCK) to determine a delay time between the two by which the pipeline clocks (CLKRISE/CLKFALL) must be delayed. As a result, the pipeline clocks are pushed out as needed so that they always transition after the array data arrives at the output latch. Therefore, as cycle time decreases, both echo clocks and data are pushed out identically and maintain their required tracking.

7 Claims, 6 Drawing Sheets

CYCLE INDEPENDENT DATA TO ECHO CLOCK TRACKING CIRCUIT

BACKGROUND OF THE INVENTION

1. Field of the Invention

The present invention generally relates to random access memory (RAM) devices and, more particularly, to an echo clock tracking circuit for tracking data output from a double data rate (DDR) RAM device.

2. Description of the Related Art

Random access memory (RAM) performance is a well known limitation to computer system performance. Processor speeds are rapidly outpacing primary memory performance, with both processor designers and system manufacturers developing higher performance memory subsystems in an effort to minimize memory performance limitations. Ideally, the memory performance would match or exceed processor performance, i.e., a memory cycle time would be less than one processor clock cycle. This is almost never the case and, so, the memory is a system bottleneck.

There are two common families of RAM memory devices used as primary storage directly accessible by the microprocessor. The first, static random access memory devices (SRAMS) are based on flip-flop circuits and retain data as long as power is supplied. The second, dynamic random access memory devices (DRAMs), store data as a function of a charge on a capacitor. The capacitors must constantly be refreshed since the charge dissipates. Both have advantages and disadvantages. DRAMs are relatively inexpensive to fabricate but are slow as compared to SRAMS. SRAMs are therefore typically reserved for use as caches. In both cases, data is clocked out of the RAM on either the rising or falling edge of a clock pulse.

Innovations in RAM technology have lead to the so called Double Data Rate (DDR) RAM. The DDR RAM allows reads and writes at twice the frequency of the applied clock by moving data on both rising and falling clock edges. One drawback to the DDR architecture is that processors have to modify their cache control logic to recognize the double-data-rate signal. With normal cache SRAM, for each processor clock cycle the SRAM delivers one piece of data, whereas with DDR there is one piece of data on the rising edge and one piece on the falling edge of the clock. Thus, the DRR RAM also features a set of echo clock outputs with a propagation delay that tracks the performance of the RAM data outputs. By using echo clocks to trigger sensing valid input data, processor input buffers are able to catch RAM data when it is there, even at frequencies of 400 to 600 MHZ. This allows each RAM to deliver data at twice the speed of conventional devices for the same clock speed.

The echo clock is important for indicating when a valid data is transferred by the RAM. This echo clock is so named since it echos the pipelined data. The loss of tracking between echo clocks and data, will result in specification violations between memory devices and microprocessor (or vice-versa). Further loss of tracking will result in data glitches that can cause system failures. These two events occur any time that the RAM device is cycled at a frequency greater than the access time of the RAM device.

SUMMARY OF THE INVENTION

It is therefore an object of the present invention to provide an echo clock circuit which ensures accurate tracking with data transfers.

It is yet another object of the present invention to automatically adjust the pipeline data clocks (CLKRISE and CLKFALL) of the RAM device as needed in order to maintain echo clock tracking and thereby prevent data glitching.

According to the invention, a comparator and variable delay circuit are provided to maintain the tracking between data and echo clocks in a memory device for any cycle time, device performance, or application condition. Pipeline data clocks (CLKRISE/CLKFALL) of the device are automatically adjusted as needed in order to maintain data to echo clock tracking and prevent data glitching. This is accomplished by providing a global data signal (dummy data signal) that tracks with the actual memory array data. This global data signal is compared to the timing of the RAM clock (CLOCK) to determine a delay time between the two by which the pipeline clocks (CLKRISE/CLKFALL) must be delayed. As a result, the pipeline clocks are pushed out as needed so that they always transition after the array data arrives at the output latch. Therefore, as cycle time decreases, both echo clocks and data are pushed out identically and maintain their required tracking.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
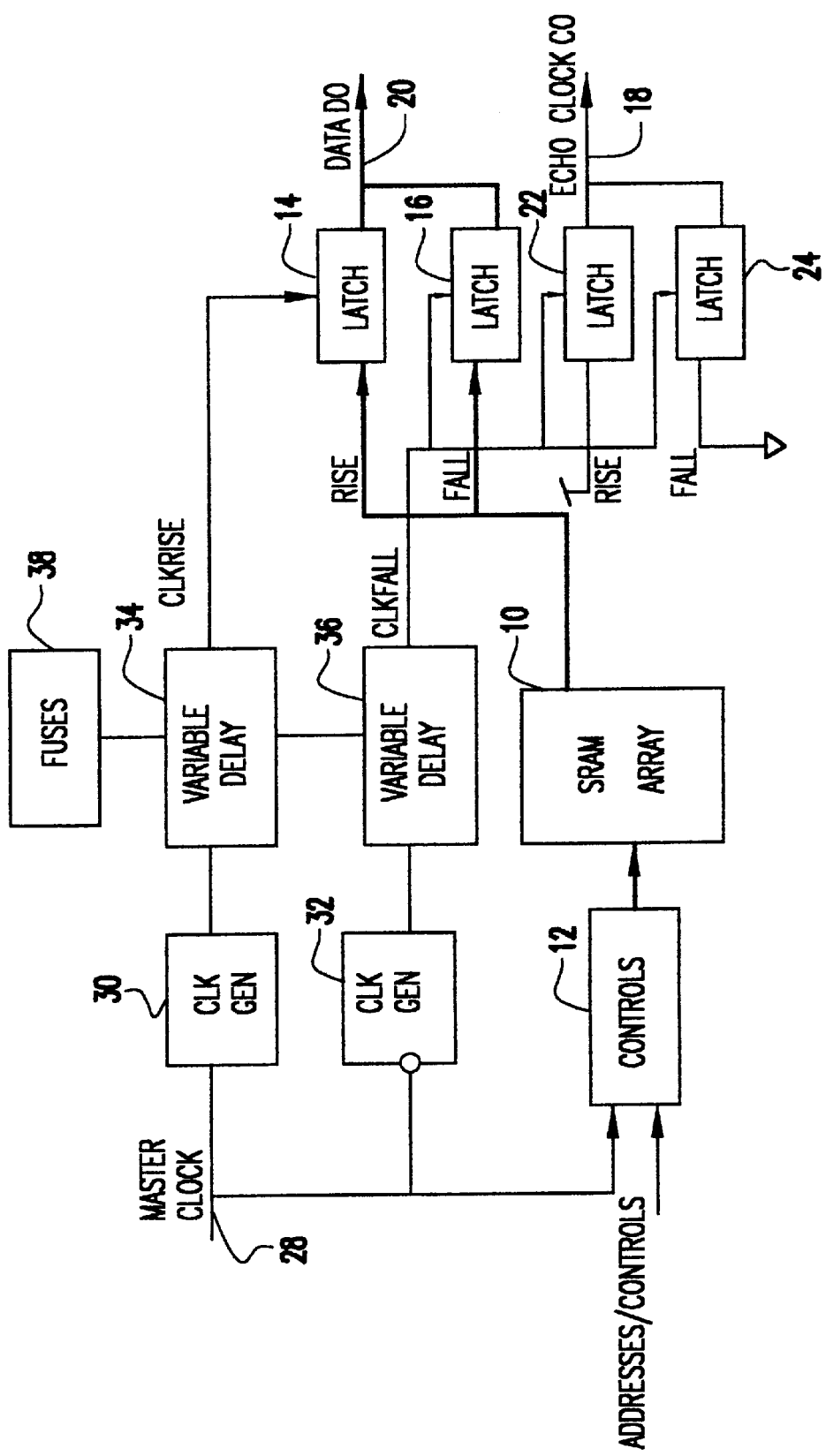
FIG. 1 is a schematic of a double data rate (DDR) SRAM with an echo clock controlled by a fuse circuit.

Referring now to the drawings, and more particularly to FIG. 1, there is shown a double data rate (DDR) SRAM with an echo clock controlled by a fuse circuit. An SRAM 10 comprises an array of addressable memory locations accessible by the memory controller 12. Data from the SRAM array 10 is divided into two groups, rise data and fall data. The rise data is latched through to a microprocessor input buffer (not shown)via latch 14 and, similarly the fall data is latched via the latch 16. Each is clocked by CLKRISE/CLKFALL of the following cycle. Latches 22 and 24 are also latched by CLKRISE/CLKFALL, respectively, to output an echo clock signal 18. In this manner the echo clock signal 18 tracks the data signal 20. That is, the echo clock signal 18 tracks the data output from the latches 14 and 16 to indicate when a valid data is available on the data line 20. The input of latch 22 is tied to a voltage high while the input of latch 24 is tied to a voltage low. A master clock signal 28 drives the controller 12.

Figure 2:
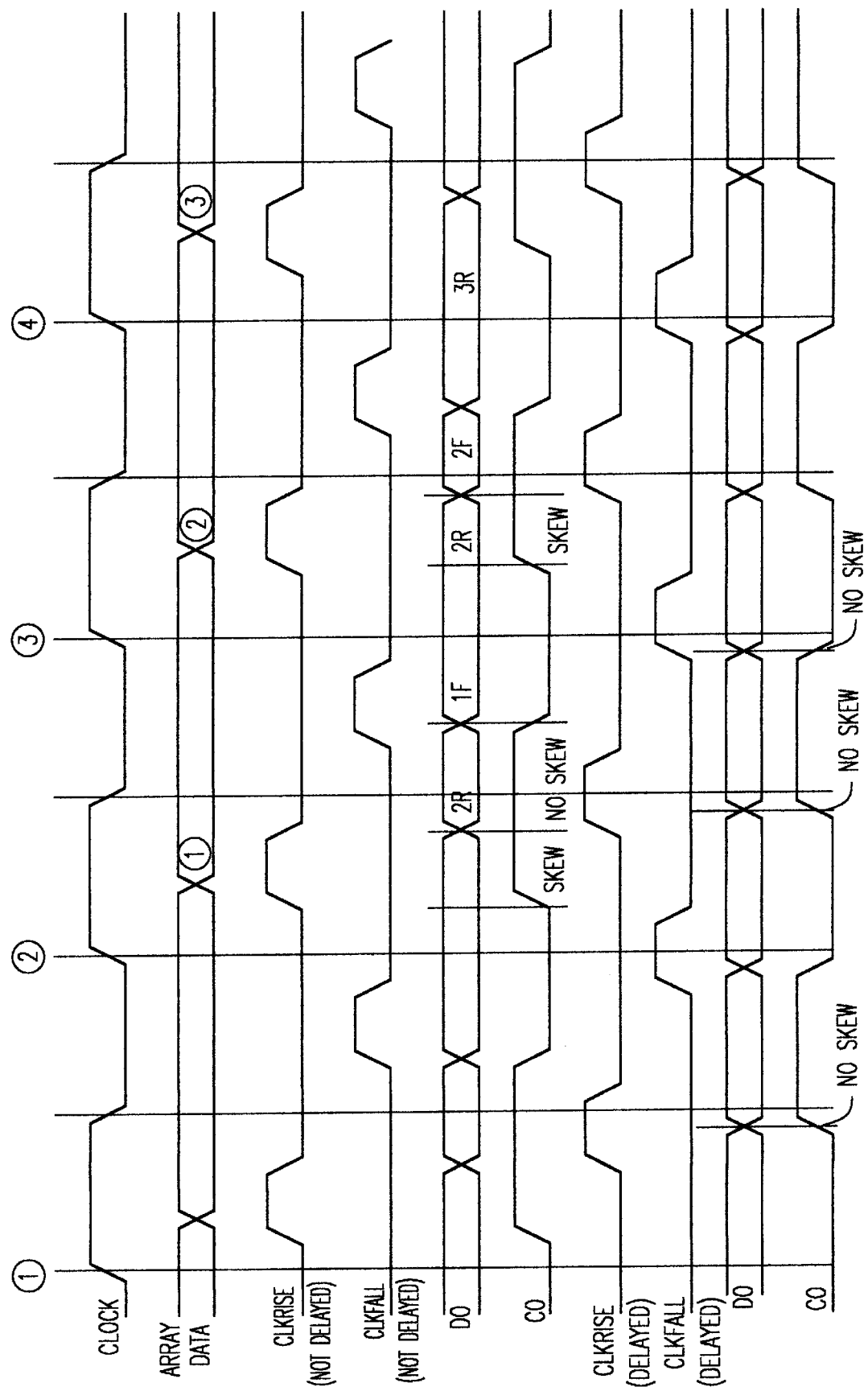
FIG. 2 is a timing diagram comparing data and echo clock timing for both clock rise and fall undelayed and delayed.

CLKRISE is generated from rising edge of the master CLOCK 28. CLKFALL is generated from falling edge of master CLOCK 28. If CLKRISE/CLKFALL clocks are not delayed, the tracking between DO (DATA) and CO (ECHO CLOCK) is lost as shown by "skew" in the timing diagram of FIG. 2. This is because DO is gated by ARRAY DATA rather than CLKRISE. However, CO is always gated by CLKRISE because of its preset input. For the case where both CLKRISE/CLKFALL are delayed, DO and CO track as shown by DO and CO at the bottom of the timing diagram. This is because both DO and CO are then gated by the CLKRISE/CLKFALL. In FIG. 2, the 1R, 1F, designation refer to the data from cycle 1 on the clock rise "R" and fall "F", respectively. The same designation applies for cycles 2 and 3 and so forth.

One solution to the delay problem is to never run cycle time faster than access time, thus seriously limiting the potential of the device. As shown in FIG. 1, another, more viable solution comprises delaying CLKRISE/CLKFALL from the master clock 28 via a delay circuit comprising clock generators 30 and 32 and variable delay circuits 34 and 36, respectively. The variable delay circuits are controlled with a laser-fused programmable delay module 38 to delay the pipeline clocks CLKRISE/CLKFALL so that array data DO is always faster than the pipeline clocks CLKRISE/CLKFALL. However, this approach requires significant characterization work to determine how much delay is required for different cycle times and SRAM performance variations. This approach also degrades pipeline access time because of the added timing margin required between array data and pipeline clocks. In addition, this approach still limits the flexibility of SRAM once the fuses are blown.

Figure 3:
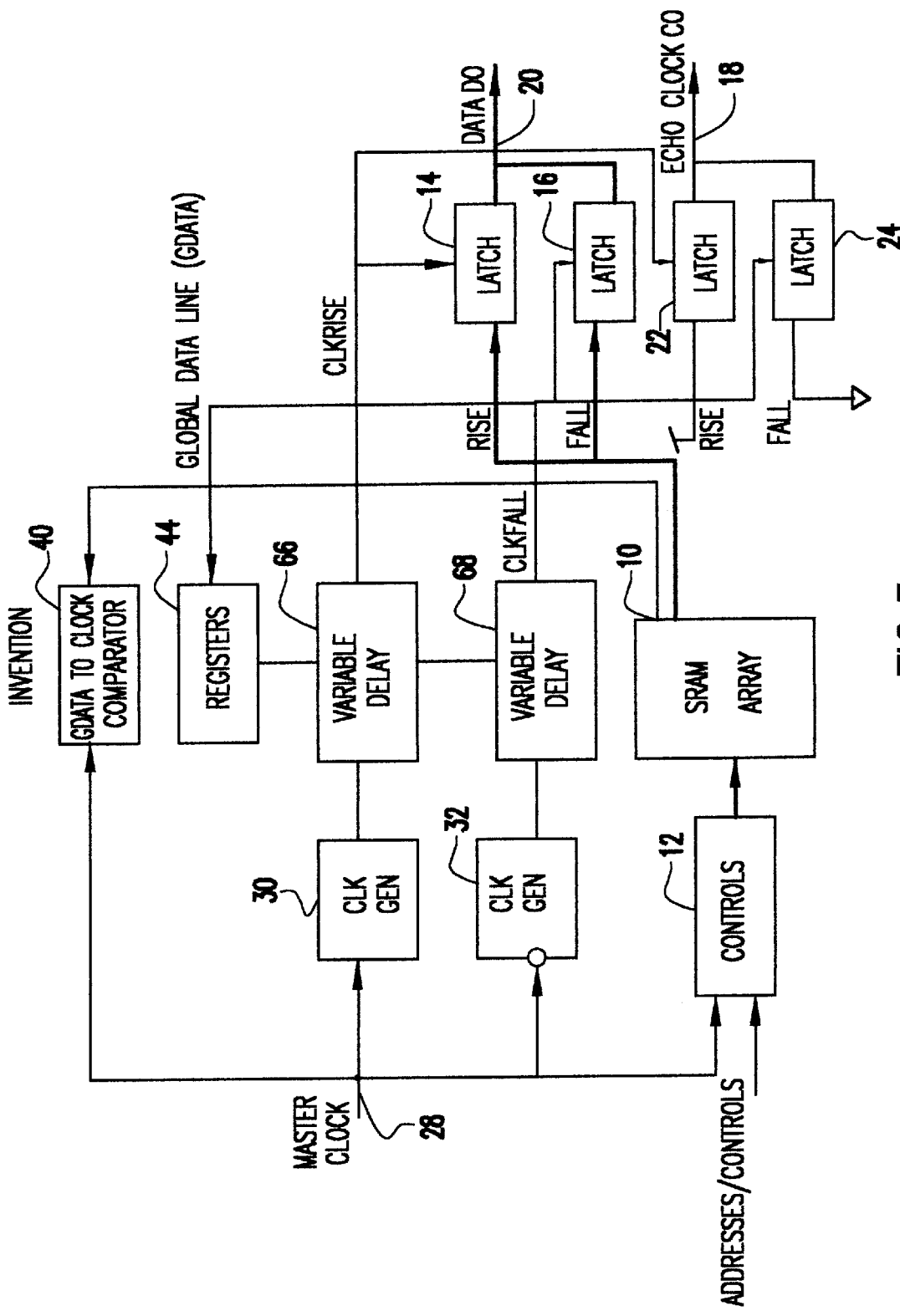
FIG. 3 is a schematic of a double data rate (DDR) SRAM with an echo clock circuit according to the present invention.

Turning now to FIG. 3, there is shown a schematic of a double data rate (DDR) SRAM with and echo clock circuit according to the present invention. The SRAM portion of the device is similar to that shown in FIG. 1 therefore similar notation is used. For example, the SRAM 10 comprises an array of addressable memory locations accessible by the memory controller 12. Data from the SRAM array 10 is divided into two groups, rise data and fall data. The rise data is latched through to a microprocessor input buffer (not shown)via latch 14 and, similarly the fall data is latched via the latch 16. Each is clocked by CLKRISE/CLKFALL of the following cycle. Latches 22 and 24 are also latched by CLKRISE/CLKFALL, respectively, to output an echo clock signal 18. In this manner the echo clock signal 18 tracks the data signal 20. A comparator is used to calculate the necessary delay to be added to the pipeline clocks CLKRISE/CLKFALL. The delays are labeled DELAY3–DELAY0, where DELAY3 has the largest delay and DELAY0 the smallest delay. The comparator 40 makes a comparison between the SRAM master CLOCK 28 and the GLOBAL DATA LINE (GDATA) 42. GDATA is provided as an output from the SRAM 10 as a dummy array data line that tracks with the array access. The calculated delay is stored in registers 44 to be used in the next clock cycle.

Figure 4:
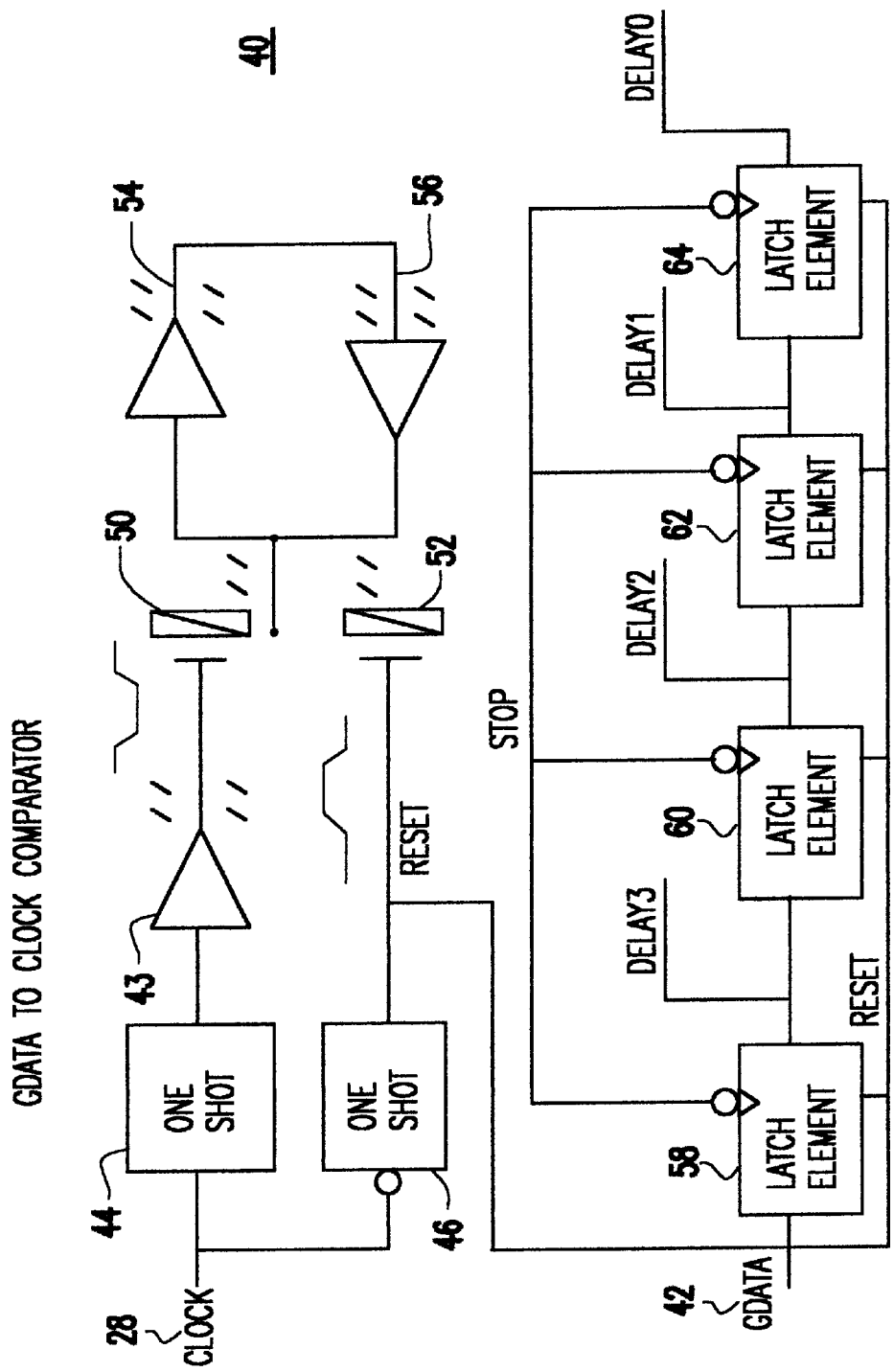
FIG. 4 is a schematic of a global data to clock signal comparator circuit.

FIG. 4 is a detailed view of the comparator 40. The inputs to the comparator are the master clock 28 and the dummy GDATA 42. One shot circuits 44 and 46 receive a rising and falling clock edge, respectively and output a small clock pulse. The rising pulse is passed through an inverter 48. Thereafter, both pulses are gated via transistors 50 and 52 to output a pulse to cascaded inverters 54 and 56 which act a simple memory circuit to hold the pulse value until the next transition of the clock 28. In this manner a stop signal is generated by the rising edge of the clock and a reset signal is generated by the falling edge of the clock.

Figure 5:
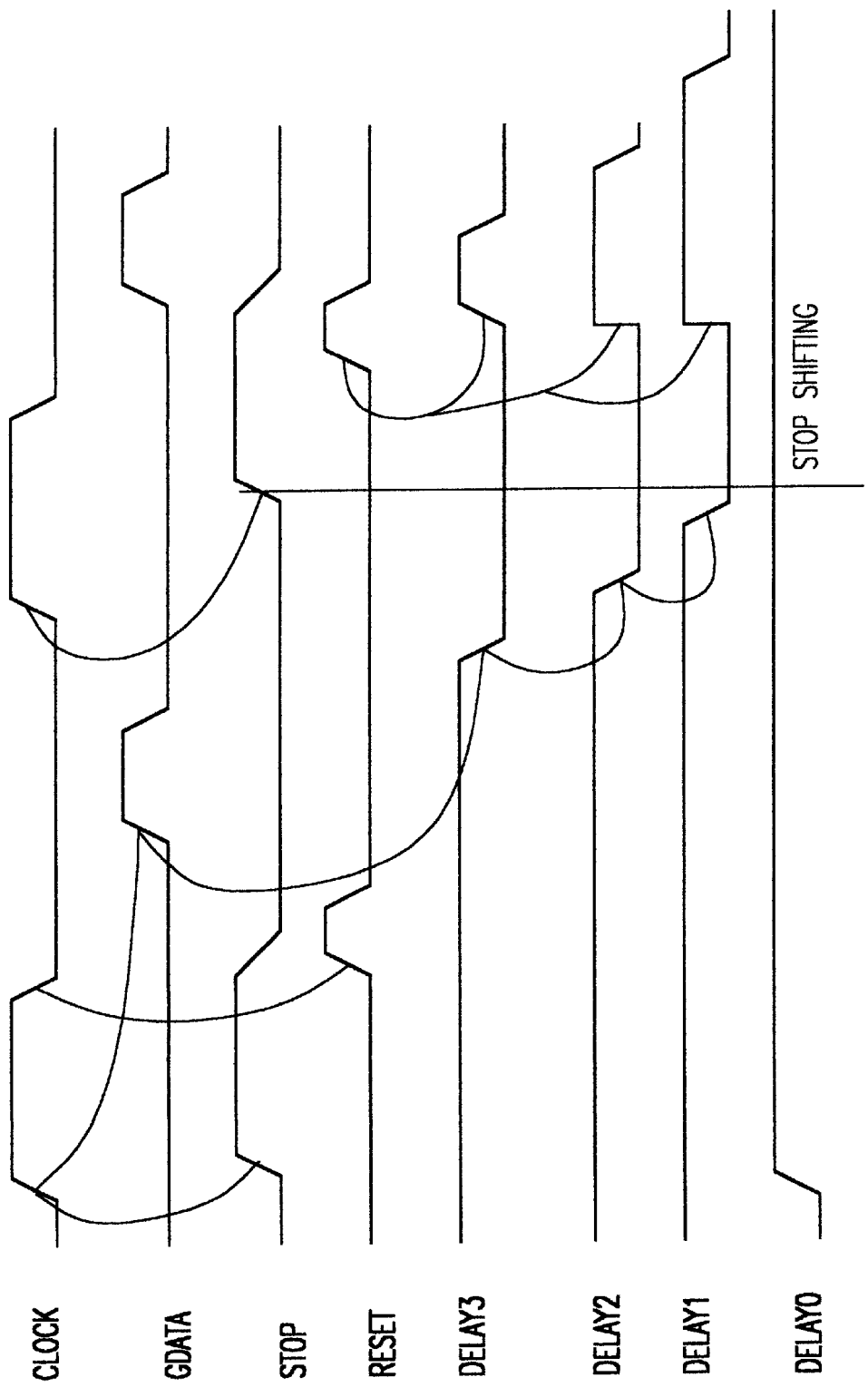
FIG. 5 is a timing diagram for generating the delay lines DELAY3–DELAY0.

Referring to FIG. 5, taken in conjunction with FIG. 4, on the rising edge of the clock pulse 28, the reset signal is disabled, and the stop signal output from the inverters 54 and 56 is brought to an active state. On the falling edge of the clock signal the latches 58, 60, 62, and 64 are reset. Thereafter when the SRAM 10 gates array outputs a data as indicated by dummy data GDATA 42, the comparator 40 begins a "peeling" process, sequentially latching GDATA through latches 58, 60, 62, and 64 until the clock pulse 28 transitions back to a high state thus enabling the stop signal. That is, if the cycle time is longer than the GDATA delay, DELAY3–DELAY0 are sequentially disabled until the next cycle's CLOCK 28 halts any further decreases in delay. However, if the cycle time is short, DELAY3–DELAY0 have no time to be disabled and the full delay DELAY3 is added to CLKRISE/CLKFALL. Once the necessary delay is calculated, the result (DELAY3–DELAY0) is registered to be used for next cycle's pipeline clocks. The registering is necessary because the delay has to be equally added to both CLKRISE/CLKFALL clocks. The timing example of FIG. 5 shows DELAY3, DELAY2, DELAY1 being disabled. Note that DELAY0 does not have enough time to be disabled. The delay signals are then passed to registers 44 and thereafter to the VARIABLE DELAY circuits 66 and 68, which delays CLKRISE/CLKFALL accordingly.

Figure 6:
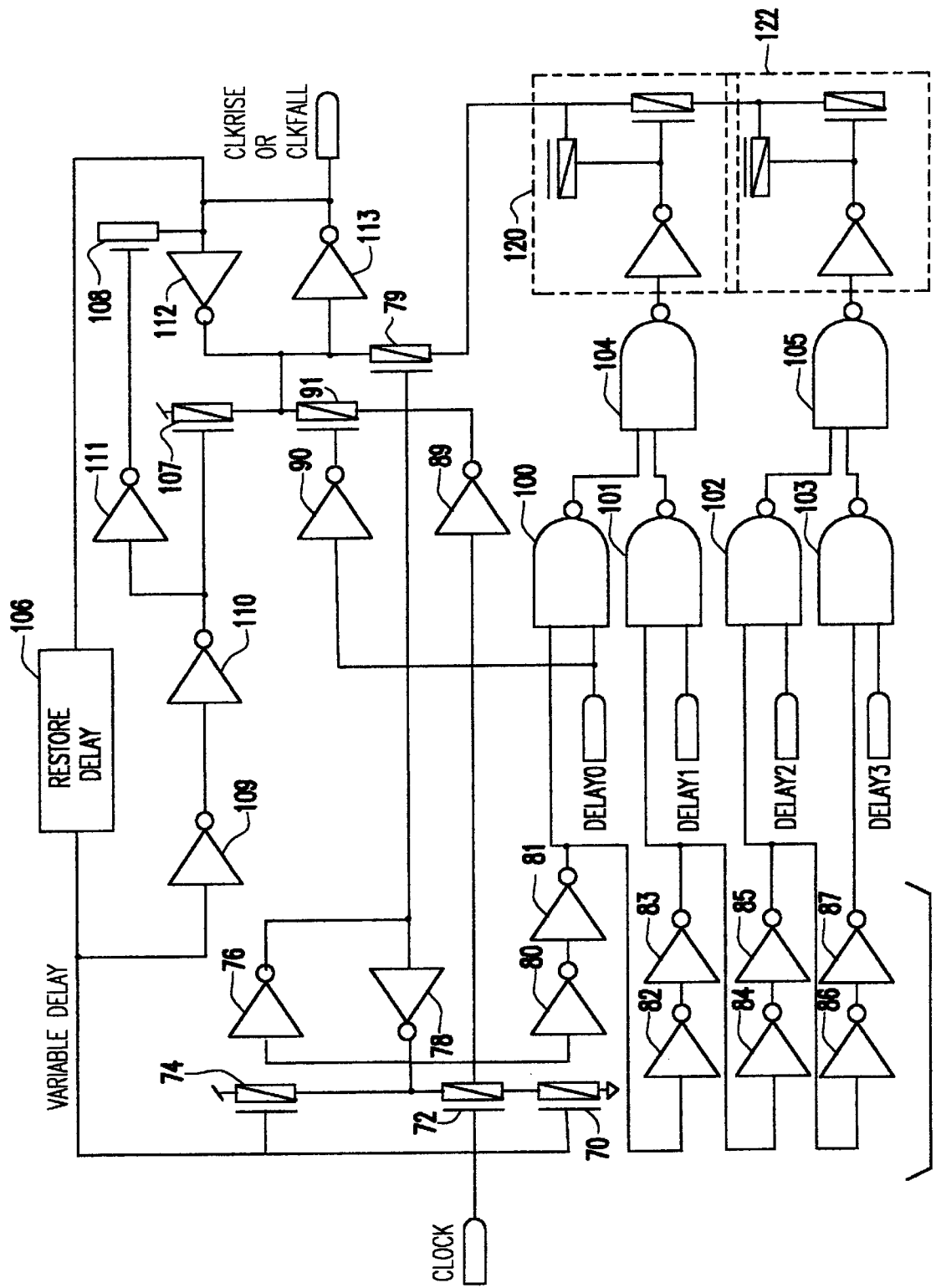
FIG. 6 is a schematic of a variable delay circuit.

Referring now to FIG. 6, there is shown a detailed view of the variable delay circuit according to the present invention. The clock signal is input into a buffer circuit comprising transistors 70, 72 and 74, cascaded buffers 76 and 78, and buffer 89. The buffered clock signal then flows through pipeline access delay buffer pairs 80–81, 82–83, 84–85, and 86–87 and then to a variable delay logic circuit comprising NAND gates 100–105. Each delay buffer pair comprises one input to the NAND gates 100–103. The second input to each of the NAND gates 100–103 is DELAY0–DELAY3 output from the comparator of FIG. 4. A restore delay circuit 106 sets the pulse width of CLKRISE and CLKFALL by resetting transistors 107 and 108 via buffers 109–111. In order to slow down CLKRISE/CLKFALL accurately, the delay units must be similar to the latch elements in the GDATA to CLOCK comparator circuit of FIG. 4. Slow path driver 120 is enabled whenever DELAY0–DELAY1 is used and slow path driver 122 is used whenever DELAY2–DELAY3 is used. Note that if no delay is necessary ( i.e. DELAY3–DELAY0=0) the delay paths are bypassed and a parallel fast path is used through buffer 90 and transistor 91 to CLKRISE/CLKFALL driver 113. An cascade connected inverter 112 acts as a latch to hold the present state of the driver 113.

In operation, if only DELAY3 is disabled, the variable delay path through NAND gate 103 is not used. If DELAY2 and DELAY3 are disabled, delay paths through NAND gates 103 and 102 are not used. Finally, if DELAY3, DELAY2, and DELAY1 are disabled, then NAND gates 101, 102 and 103 are not used. In this manner CLKRISE/CLKFALL is automatically adjusted such that the data signal is simultaneously latched out with the echo clock signal in order to maintain echo clock tracking and thereby prevent data glitching.

While the invention has been described in terms of a single preferred embodiment, those skilled in the art will recognize that the invention can be practiced with modification within the spirit and scope of the appended claims.

We claim:

1. A memory system for a high speed double data rate (DDR) memory which generates a data signal and an echo clock signal, comprising:

a memory controller clocked by a master clock signal;

a random access memory (RAM) array receiving input from said memory controller and outputting a global data signal;

a comparator for receiving the global data signal and the master clock signal to determine a delay timing there between; and a variable delay circuit for receiving said delay timing signal and generating a delayed pipelined clock signal for simultaneously latching out said data signal and said echo clock signal.

2. A memory system for a high speed double data rate (DDR) memory as recited in claim 1 wherein said RAM array comprises static random access memory (SRAM) devices.

3. A memory system for a high speed double data rate (DDR) memory as recited in claim 1 wherein said RAM array comprises dynamic random access memory (DRAM) devices.

4. A memory system for a high speed double data rate (DDR) memory as recited in claim 1 wherein said comparator comprises:

means for generating a stop signal on a rising master clock edge and a reset signal on a falling master clock edge; and a plurality of latches connected in series, a first latch in said series receiving said global data signal, wherein said latches are reset by said reset signal and thereafter said latches sequentially output a plurality of DELAY signals in accordance with a presence of said global data signal until said stop signal is received.

5. A memory system for a high speed double data rate (DDR) memory as recited in claim 4 further comprising a register for storing said DELAY signals.

6. A memory system for a high speed double data rate (DDR) memory as recited in claim 4 wherein said variable delay circuit comprises:

a plurality of delay buffers connected in series for delaying said master clock signal;

a plurality of logic gates for enabling a plurality of variable delay paths, each of said logic gates having a first input connected to sequential ones of said delay buffers and a second input connected to receive one of said plurality of DELAY signals; and a delayed pipelined clock driver for outputting a pipelined CLKRISE/CLKFALL signal in accordance with said enabled variable delay paths.

7. A memory system for a high speed double data rate (DDR) memory as recited in claim 6 further comprising a fast path for immediately outputting said pipelined CLKRISE/CLKFALL signal if said comparator determines no delay is required.

\* \* \* \* \*